United States Patent [19]

Prevot

[11] 4,427,938
[45] Jan. 24, 1984

[54] VERY-WIDE-BAND SAMPLERS

[75] Inventor: Julien Prevot, Paris, France

[73] Assignee: Lignes Telegraphiques et Telephoniques, France

[21] Appl. No.: 213,580

[22] Filed: Dec. 5, 1980

[30] Foreign Application Priority Data

Dec. 27, 1979 [FR] France .............................. 79 31798

[51] Int. Cl.³ ...................... G01R 23/02; G01R 23/04
[52] U.S. Cl. .................................. 324/78 D; 324/95; 329/161
[58] Field of Search ................... 324/95, 78 R, 78 D; 329/161; 455/330; 333/208

[56] References Cited

U.S. PATENT DOCUMENTS 2,832,885 4/1958 Brett .................................. 329/161
3,609,559 9/1971 Evans ................................ 329/161

FOREIGN PATENT DOCUMENTS 1061392 7/1959 Fed. Rep. of Germany .
1137486 10/1962 Fed. Rep. of Germany .

OTHER PUBLICATIONS

Hewlett-Packard Journal; Oct. 1966; pp. 10-15.
Merkelo, J.; Hewlett-Packard Journal; Apr. 1977, p. 10-13.

Primary Examiner—Ernest F. Karlsen
Attorney, Agent, or Firm—Roland Plottel

[57] ABSTRACT

A sampler is constituted by a section of a rectangular waveguide in which are mounted two diodes connected in series by means of a conductor which is placed at equal distance from the two large faces of the waveguide, one end of the conductor being connected to the input of the sampler and the other end being connected to a matched load.

5 Claims, 3 Drawing Figures

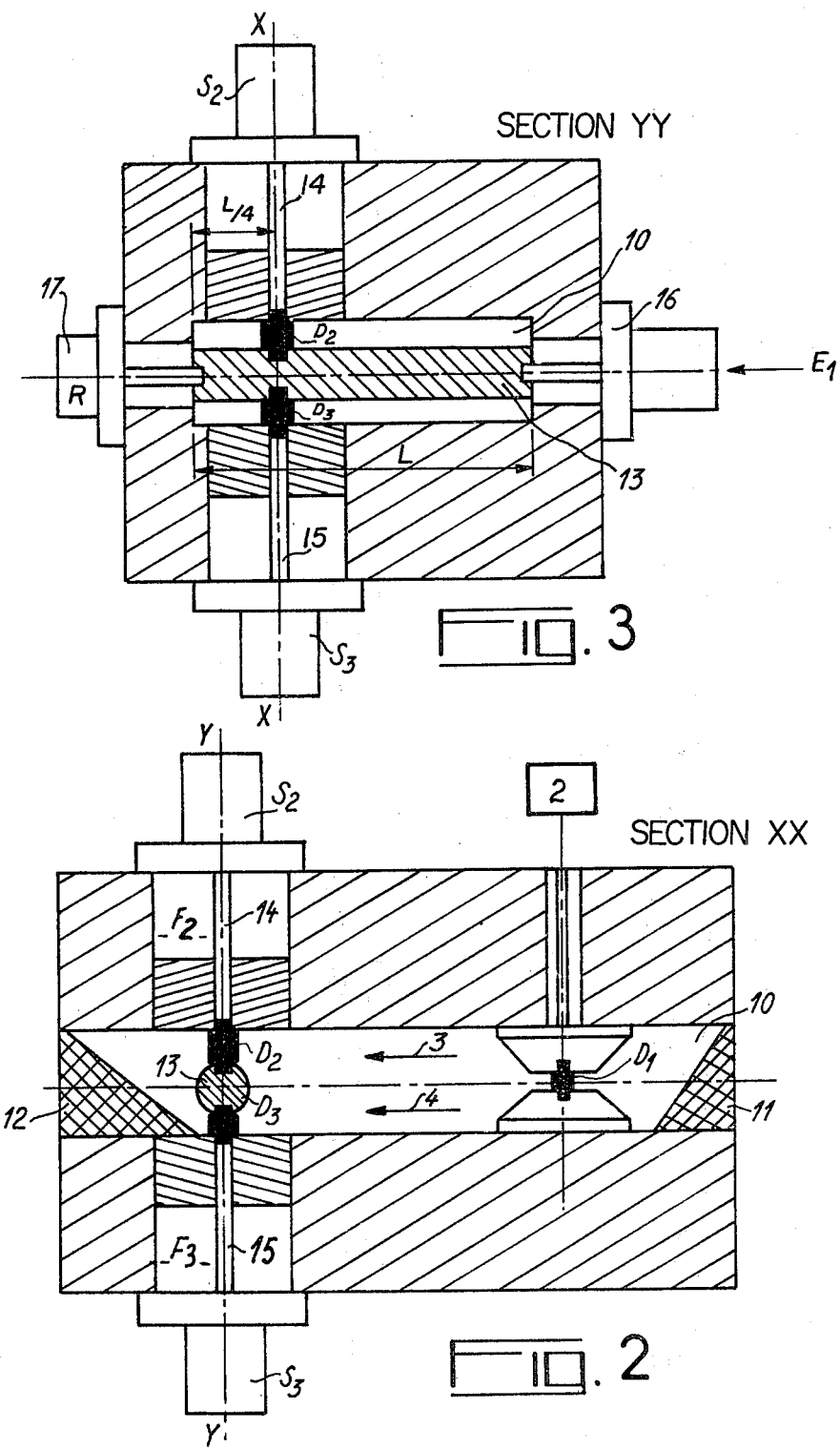

VERY-WIDE-BAND SAMPLERS

This invention relates to a sampler which covers a wide band of frequencies extending from the lower end of the frequency spectrum to several tens of gigahertz. In accordance with accepted usage in metrology, the term "sampler" which is employed in the following specification will be understood to designate a circuit comprising a local source of short pulses having a spectrum constituted by a discrete sequence of lines at frequencies which are multiples of the recurrence frequency and associated with a nonlinear element for beating with an applied signal whose frequency is to be determined. A low-frequency output filter transmits the signal at the beat frequency (between the frequency of the applied signal and the frequency of a spectral line of the local source) located within its passband for the purpose of measurement. Determination of the frequency therefore entails the need for determination of the line which has taken part in the beat. This operation relates to the field of data-processing and has already been described in the literature, in particular in an article published in the Hewlett Packard Journal (May, 1978 issue) and entitled : "Microprocessor-controlled harmonic heterodyne microwave counter also measures amplitude". The fabrication of a sampler of this type involves the use of a relatively complex assembly of circuits and this complexity increases as the range of frequencies to be covered increases in width. In view of the fact that current trends in technology are directed towards the use of constantly higher frequencies, it is necessary to ensure that measuring instruments operate within a frequency band of constantly increasing width. The requirements of commercial distribution, however, are such that the cost price of these instruments must be reduced to a minimum.

As stated in the article mentioned above, the most costly component is the sampler. The aim of the present invention is to permit simple construction of a circuit of this type and consequently to permit a reduction in cost price of the measuring assembly.

The present invention is based on the fact that the properties of waveguides and more particularly of rectangular-section waveguids are utilized in order to constitute a high-pass filter. The invention is more especially distinguished by the fact that one and the same waveguide section is employed both for transmission of pulses from the local source, for filtering by removal of low-frequency components from the spectrum and for beating with the signal whose frequency is to be measured in a known circuit constituted by two diodes mounted in series within said waveguide section.

The sampler in accordance with the present invention essentially comprises the following elements:

a source of short pulses having a time-duration t and a recurrence frequency F;

a waveguide section having a cutoff frequency equal to a simple fraction of the maximum frequency of the signal to be sampled;

a conductor placed in parallel relation to the large walls of the waveguide in a median plane;

two mixer diodes connected in series and placed in a plane at right angles to the large walls at a location of maximum intensity of the electric field in the $TE_{op}$ mode, where $p > 1$ on each side of said conductor;

a low-frequency output circuit connected to each mixer diode.

In a preferred alternative embodiment of the invention, the pulse source is a diode mounted within said waveguide section and placed in the same manner as the mixer diodes within a right section of said waveguide.

The sampler in accordance with the invention is particularly simple to construct, of small overall size and high strength, thus making it particularly well-suited to utilization as a measuring instrument.

These and other features of the invention will be more apparent upon consideration of the following description and accompanying drawings, wherein:

FIG. 2 is a longitudinal sectional view of the sampler assembly;

FIG. 3 is a transverse sectional view of the waveguide at the level of the mixer diodes.

Figure 1:
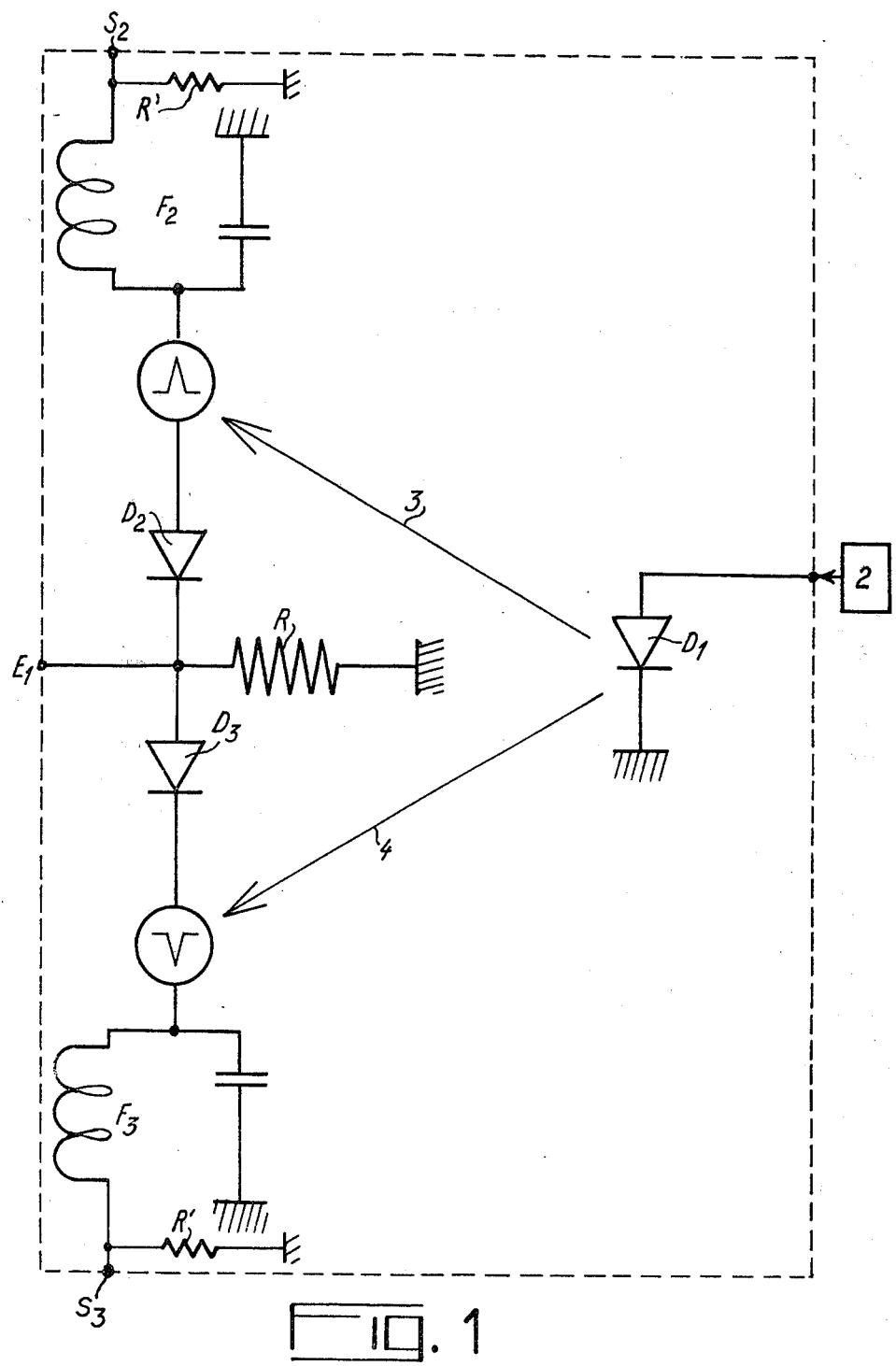
FIG. 1 is an equivalent circuit diagram of the sampler.

FIG. 1 represents the equivalent diagram of a sampling circuit which is already known per se. This figure shows the local oscillator in which the high-frequency energy delivered by a source 2 is used to generate pulses. The diode $D_1$ defines the waveform and recurrence frequency of the pulses. Theses latter are transmitted to the mixer circuit which is essentially constituted by diodes $D_2$ and $D_3$ connected in series. The coupling between the diode $D_1$ and the mixer circuit is represented diagrammatically by the arrows 3 and 4. Each diode $D_2$ and $D_3$ is connected to a low-frequency output $S_2$ and $S_3$ respectively through a low-pass filter designated respectively by the references $F_2$ and $F_3$ and constituted by an inductance coil and a capacitor. The diodes are self-biased by the resistors $R'$. The signal whose frequency is to be measured is applied at $E_1$. The resistor R connected to the node or common point between the two diodes serves to match the impedance at $E_1$. The diagram corresponds to a circuit of a type which is well-known to anyone versed in the art and the invention relates to the construction of the circuit in waveguide technology.

FIGS. 2 and 3 correspond to a preferred alternative embodiment of the invention. As is apparent from FIG. 2, the pulse source constituted by a diode $D_1$ associated with the continuous-wave source 2 is placed within a rectangular-section waveguide 10. There is placed in proximity to the diode $D_1$ a load 11 for absorbing the energy which propagates towards the right within the waveguide. The energy which propagates towards the left is transmitted within the waveguide 10 in the direction of the arrows 3 and 4 towards the diodes $D_2$ and $D_3$ constituting the nonlinear circuit at a fixed level which is independent of the frequency of the source 2. The waveguide section located between the diodes $D_1$ and $D_2$–$D_3$ performs the function of a high-pass filter which transmits only the high-frequency lines of the frequency spectrum of the pulses delivered by the diode $D_1$. In a preferred alternative embodiment, only the lines of a rank higher than 7 (although this value is not given by way of limitation) are transmitted by the waveguide without attenuation. It is well-known that the waveguide cutoff frequency is defined solely by the dimensions a and b of its right section. A second load 12 is placed on the left of the nonlinear circuit in order to prevent any reflection of unused energy. The diodes $D_2$ and $D_3$ are rigidly fixed mechanically to a rod 13 disposed along the long dimension of the waveguide at right angles to the direction of propagation as shown more clearly in FIG. 3. One of the electrodes of each diode is in contact with said conductive rod. The other electrode of each diode is connected respectively to each central conductor 14 and 15 of a coaxial line which terminates in the coaxial outputs $S_2$ and $S_3$ respectively. In accordance with well-known practice, the filters $F_2$ and $F_3$ are thus constituted by the coaxial line segment placed between the diode and the associated output. As is more clearly shown in FIG. 3, the rod 13 is maintained parallel to the large walls of the rectangular waveguide 10 between the central conductor of the connector 16 constituting the input $E_1$ and the matched load 17.

The lines of the section planes of FIGS. 2 and 3 are shown respectively at Y—Y and X—X. It is apparent from FIG. 3 that the diodes $D_2$ and $D_3$ are placed within the rectangular section of the waveguide 10, not along the axis of symmetry but at a distance from the short left-hand wall which is equal to one-quarter of the long dimension of the waveguide. This particular arrangement establishes favorable conditions for operation of the sampler circuit at high frequency. In fact, the energy which propagates within the waveguide 10 without attenuation is constituted by the upper portion of the spectrum of pulses produced by the diode $D_1$. Different modes of propagation are therefore established within the guide; the electric field distribution within the right section differs from one mode to another as is well-known. Localization of the mixer diodes in the plane of symmetry of the guide corresponds to localization of the diodes at the intensity maximum of the electric field in respect of the fundamental mode $TE_{01}$. As a result of localization of the diodes at a distance from a short side which is equal to $\frac{1}{3}$ of the long dimension of the guide, the diodes are placed in the vicinity of the maximum value of electric field in respect of the mode of order 2. The chosen position corresponds to a high intensity of the field distributions of the first three $TE_{on}$ modes. The positioning of the diodes is a compromise between the reduction in distance from a short side of the waveguide which corresponds to the maximum value of electric field of the higher modes and a reduction in value of the maximum field with the order of the mode.

The conductor 13 of the alternative embodiment just described is a rod having a circular cross-section and a length equal to the longest dimension of the waveguide. The shape of the conductor 13 is a relatively minor consideration. Thus the conductor may consist of a metallic strip or of a rod having any desired cross-section without producing any appreciable difference in the characteristics of the sampler. The cross-section of the conductor 13 does have an influence on the impedance at the input $E_1$ of the sampler.

In one particular form of construction, the following elements were employed:
diode $D_1$ (Hewlett-Packard Type No. 5082-885
diodes $D_2$ and $D_3$: Hewlett-Packard Type No. 5022-2711
a source 2 at 1 GHz±50 MHz in order to facilitate the counting operation
a matched load 17: type EMC 8021-3
the conductor 13 is a brass rod 3.2 millimeters in diameter
the waveguide 10 has the following dimensions:
  a=20 millimeters
  b=5.8 millimeters.

A sampler of this type delivers a constant level at ±2 dB when the frequency of the applied signal is a sine wave which covers the frequency band between 0.1 and 24 GHz.

What is claimed is:

1. A very-wide-band sampler comprising:
   (a) local oscillation means for generating pulse signals having a short time duration and a predetermined recurrence frequency, said local oscillation means comprising a high-frequency local source associated with a first diode mounted in a first rectangular cross-section of a waveguide element;
   (b) said rectangular waveguide element whose cutoff-frequency is a multiple of the said recurrence frequency and comprising, said first diode placed in said first cross-section, a second diode and a third diode connected in series through a conducting bar and placed in a second cross-section of the rectangular waveguide, said conducting bar extending centrally in said waveguide in said second cross-section; said first diode being connected to said local source to transmit said pulse signals within said waveguide, said conducting bar being connected at one end to a signal input for reception of signal whose frequency is to be determined, and connected at its other end to a matched load, said second and third diodes constituting a mixer for beating the said input signal with said transmitted pulse signal; and
   (c) low-frequency output circuits for the signals at the beat frequency provided by said mixer, said low-frequency output circuits being constituted by two coaxial line segments placed in the said second cross-section and having the central conductor connected to said second and third diodes respectively.

2. A sampler according to claim 1, wherein said pulse source comprises a diode mounted within a second right section of the guide at right angles to the first right section.

3. A sampler according to claim 1 or claim 2, wherein said two diodes are located at a distance equal to $\frac{1}{3}$ of the long dimension of the waveguide.

4. A sampler according to claim 1, wherein said conductor is a cylindrical metal rod.

5. A sampler according to claim 1, wherein said conductor is a conductive plate which is parallel to the large faces of the waveguide.

* * * * *